(12) United States Patent
Chen

(10) Patent No.: US 6,844,595 B2
(45) Date of Patent: Jan. 18, 2005

(54) ELECTROSTATIC DISCHARGE PROTECTION CIRCUIT WITH HIGH TRIGGERING VOLTAGE

(75) Inventor: Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 295 days.

(21) Appl. No.: 09/747,209

(22) Filed: Dec. 22, 2000

(65) Prior Publication Data
US 2001/0007521 A1 Jul. 12, 2001

(30) Foreign Application Priority Data
Jan. 11, 2000 (TW) .......................... 89100331 A

(51) Int. Cl.[7] .............................................. H01L 23/62
(52) U.S. Cl. ...................................... 257/355; 257/173
(58) Field of Search ................................ 257/173, 355, 257/356, 357, 358, 359, 360, 361, 362, 363, 364, 365, 546, 547, 109, 162, 146, 371, 335, 288, 296, 301, 304, 618, 894, 653

(56) References Cited

U.S. PATENT DOCUMENTS

| | | | | |
|---|---|---|---|---|
| 4,153,909 A | * | 5/1979 | Dobkin ........................ | 357/44 |
| 5,869,873 A | * | 2/1999 | Yu .............................. | 257/362 |
| 6,114,731 A | * | 9/2000 | London ....................... | 257/355 |
| 6,215,135 B1 | * | 4/2001 | Schroder ..................... | 257/173 |
| 6,281,554 B1 | * | 8/2001 | Pan ............................. | 257/357 |
| 6,455,898 B1 | * | 9/2002 | Liu et al. .................... | 257/360 |
| 6,476,422 B1 | * | 11/2002 | Yu .............................. | 257/173 |

FOREIGN PATENT DOCUMENTS

JP   405121685 A  *  5/1993

\* cited by examiner

*Primary Examiner*—Long Pham
*Assistant Examiner*—Dana Farahani
(74) *Attorney, Agent, or Firm*—Ladas & Parry

(57) ABSTRACT

An ESD protection circuit comprising a substrate having a first conductivity type, a well region having a second conductivity type, a first doping region having the first conductivity type, and a second doping region having the second conductivity type. The substrate is coupled to the reference potential, the well region is formed on the substrate and electrically coupled to the node, the first doping region is electrically floated on the surface of the well region, and the second doping region is disposed on the substrate and electrically coupled to the reference potential. Moreover, the electrostatic discharge current of the node provides a voltage with sufficient magnitude to breakdown the conjunction interface between the well region and the substrate, also triggering a BJT comprising the well region, substrate and the second doping region for dissipating the electrostatic discharge current. The first doping region, when its electrostatic discharge current is greater than a predetermined current, reduces the potential difference between the node and the reference potential.

7 Claims, 12 Drawing Sheets

ELECTROSTATIC DISCHARGE PROTECTION CIRCUIT WITH HIGH TRIGGERING VOLTAGE

BACKGROUND OF THE INVENTION

1. Field of the Invention

The present invention relates to an electrostatic discharge circuit (ESD) with high triggering discharge providing good ESD protection and avoiding the latch up effect.

2. Description of the Related Art

Generally, in order to protect semiconductor chips from damage caused by high voltage generated from contact with objects with electrostatic charge (ESD) during the manufacturing process, there is an ESD protection circuit configured between the output port of the chip and the power supply port. Per requirement of the circuit, the ESD protection circuit should remain in an open state through normal operation so that the power supply port and the output/input port maintain normal functioning. It is only when the ESD occurs at an end of the ESD protection circuit that the circuit is in a short state for dissipating the ESD current to protect the internal circuit of the semiconductor chips.

The conventional ESD protection circuit can be divided into two categories. One features a bipolar transistor and the other utilizes the semiconductor control rectifier, SCR, as the primary component.

The bipolar junction transistor (BJT) usually consists of parasitic BJT of the source/substrate/drain of the MOS transistor at the output port. Since the output port of the MOS transistor requires extremely high driving forces, the parasitic BJT must be able to disperse large amounts of current when an ESD event takes place. However, for the ESD protection circuit between the input port and the power supply circuit, such a utility will result in a substantial increase in transistor size. Moreover, the holding voltage of the BJT is conventionally large, higher than approximately 7 volts. Therefore, a large ESD current will generate very high temperature in the BJT. If the ESD current only passes through part of the MOS transistor, the MOS transistor is easily overloaded and impaired. Thus, it is difficult to design an ESD protection circuit using BJT.

The ESD protection circuits at present mostly feature an SCR and have advantages of low holding voltage (app. 1.6 voltage), low triggering current and small size. Nevertheless, such an ESD protection circuit design has problems when undergoing ESD electromagnetic comparability (EMC) tests at the system-level. During the test, the ESD current at the output port is actually dissipated by SCR. However, if the voltage of the output port is close to 3 volts before the EMC/ESD test, then, after the EMC/ESD test, the SCR will hold the potential at the I/O port to the holding potential (app. 1.6 volt). This will result in the suspension of the whole system, may even burn a part of the semiconductor chip.

SUMMARY OF THE INVENTION

Therefore, in order to solve the above-described problems, an object of the present invention is to provide an ESD protection circuit with high triggering current, having the advantages of low holding voltage and high triggering current and using a very small area of semiconductor chips.

The present invention achieves the above-indicated objects by providing an ESD protection circuit with high triggering current. The ESD protection circuit of the present invention is electrically coupled to a coupling node and a reference potential for dissipating the electrostatic current at the node. The ESD protection circuit comprises a substrate having a first conductivity type, a well region having a second conductivity type, a first doping region having the first conductivity type, and a second doping region having the second conductivity type. The substrate is coupled to said reference potential, the well region is formed on the substrate and electrically coupled to the node, the first doping region is electrically floated on the surface of the well region, and the second doping region is disposed on the substrate and electrically coupled to said reference potential. Moreover, the electrostatic discharge current of the node provides a voltage with sufficient magnitude to breakdown the conjunction interface between the well region and the substrate, also triggering a BJT comprising the well region, substrate and the second doping region for dissipating the electrostatic discharge current. The first doping region, when its electrostatic discharge current is greater than a predetermined current, reduces the potential difference between the node and the reference potential.

The present invention provides a second ESD protection circuit with high triggering voltage, coupled to a node and a reference voltage, for dissipating the electrostatic current generated from the node. The electrostatic discharge protection circuit of the present invention comprises a BJT and a first doping region having the first conductivity type. The BJT comprises an emitter, a base and a collector, wherein, the emitter and the base are electrically coupled to the reference potential, and the collector comprised of a collector region with a second conductivity type is electrically coupled to the node. The first doping region having a first conductivity type is floated in the collector region and forms a conjunction interface with the collector region. The first doping region, when the electrostatic discharge current is greater than a predetermined current, reduces the potential difference between said node and said reference potential.

When an ESD event takes place at the node, the junction interface between the base and the collector breaks down first which consequently triggers the BJT, and holds the potential at the node at the first holding potential. If the current keeps increasing till it reaches a predetermined value, the electrically floated first doping region will be activated on taking part on maintaining the holding potential of the node at a even lower second holding potential. The first holding potential and the predetermined potential may be adjusted with accordance to the circuit configuration, and the second holding potential is kept at approximately 1.6 volt.

Similarly, the present invention provides a third electrostatic discharge protection circuit with high trigger current, electrically coupled to a node and a reference potential for dissipating the electrostatic voltage formed at said nod0. The electrostatic discharge protection circuit comprises a base having a first conductivity type, a well region having a second conductivity type, a first doping region having said first conductivity type and a second doping region having said second conductivity type. The base is electrically coupled to the reference potential, the well region is formed on the substrate and electrically coupled to the node, the first doping region is electrically floated on the well region and electrically coupled to the node and the second doping region is electrically floated on the base.

The present invention further provides a fourth electrostatic discharge protection circuit with high trigger current, electrically coupled to a node and a reference potential for dissipating the electrostatic voltage formed at said node. The electrostatic discharge protection circuit comprises a BJT and a second doping region with the second conductivity type. The BJT comprises an emitter, a base and a collector, wherein, the emitter and the base are electrically coupled to the node, the collector is comprised of a collector region with a first conductivity type and electrically coupled to said reference potential, and the second doping region is floated in the collector region, and forms a conjunction interface with the region. If the first conductivity type is an n-type, the second conductivity type is p-type; similarly, if the first conductivity type is p-type, the second conductivity type is n-type.

One advantage of the ESD protection circuit of the present invention is miniaturized size. Because the second holding potential is very low, the energy wasted in the circuit is reduced to minimum, hence the area held by the ESD protection circuit can be reduced while lessening the chance of blowing the components.

The second advantage of the present invention is that there will be no latching-up incident during EMC/ESD testing. As long as the first holding potential is greater than the potential at normal condition, and the predetermined potential is greater than the maximum current at EMC/ESD testing, latching-up will not take place during the EMC/ESD testing.

These and further features, aspects and advantages of the present invention, as well as the structure and operation of various embodiments thereof, will become readily apparent with reference to the following detailed description of a presently preferred, but nonetheless illustrative embodiment when read in conjunction with the accompanying drawings, in which like reference numbers indicate identical or functionally similar elements throughout the enumerated Figures.

BRIEF DESCRIPTION OF THE DRAWINGS

The drawings referred to herein will be understood as not being drawn to scale except if specially noted, the emphasis instead being placed upon illustrating the principles of the present invention. In the accompanying drawing.

DETAILED DESCRIPTION OF THE PREFERRED EMBODIMENTS

Reference is now made in detail to an embodiment of the present invention that illustrates the best mode presently contemplated by the inventor(s) for practicing the present invention. Other embodiments are also described herein.

Figure 1:
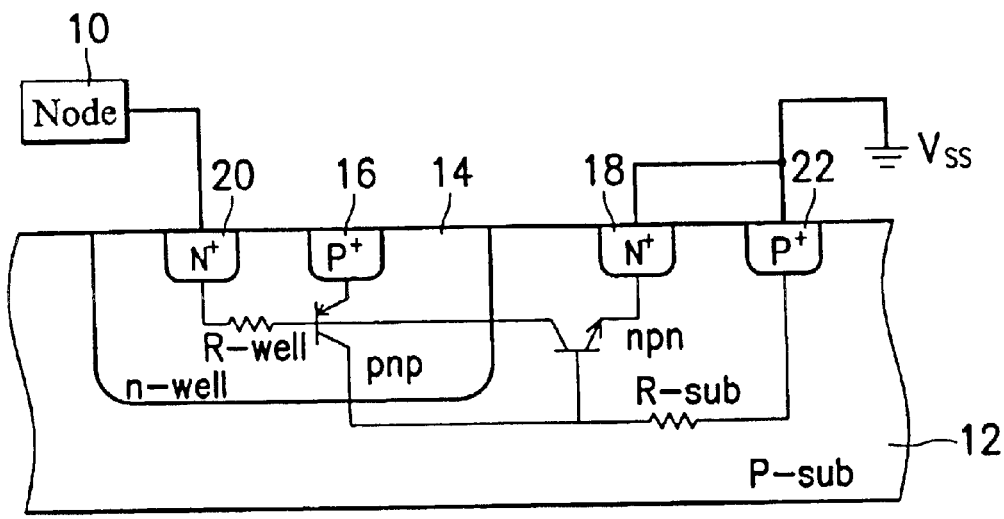
FIG. 1 is the schematic sectional diagrams of the ESD protection circuit of the first embodiment of the ESD protection circuit of the present invention.

FIG. 1 represents a sectional schematic semiconductor diagram of the ESD protection circuit of the present invention. The present invention provides an ESD protection circuit for dissipating the ESD current formed at the node 10 to a reference potential, denoted as Vss in the present invention. The ESD protection circuit comprises a substrate 12 of a first conductive type, a well region 14 of a second conductive type, a first doping region 16 of the first conductive type, a second doping region 18 of the second conductive type, a third doping region 20 of the second conductive type and the forth doping region 22 of the first conductive type. To simplify the following description, the first conductive type is denoted as the P-type, and the second conductive type is denoted as the n-type. The substrate 12 is electrically coupled to the reference potential Vss via the forth doping region 22. In other words, the forth region coupled to the reference potential Vss is disposed on the surface of the base 12 as the ohmic connection of the substrate 12. Similarly, the well region 14 is electrically coupled to the node 10 via the third doping region 20. The first doping region 16 is electrically floated on the surface of the well region 14. The first doping region 16, the well region 14 and the substrate 12 thus form a vertical pnp Bipolar junction transistor (BJT). The second doping region 18 is formed on the surface of the substrate 12, and electrically coupled to the reference potential Vss. The well 14, the base 12 and the second doping region 18 thus form a lateral npn BJT. The substrate 12 comprises a parasitic resistor R-sub, and similarly, the well region comprises a parasitic R-well resistor, as shown in FIG. 1.

Figures 2A, 2B:
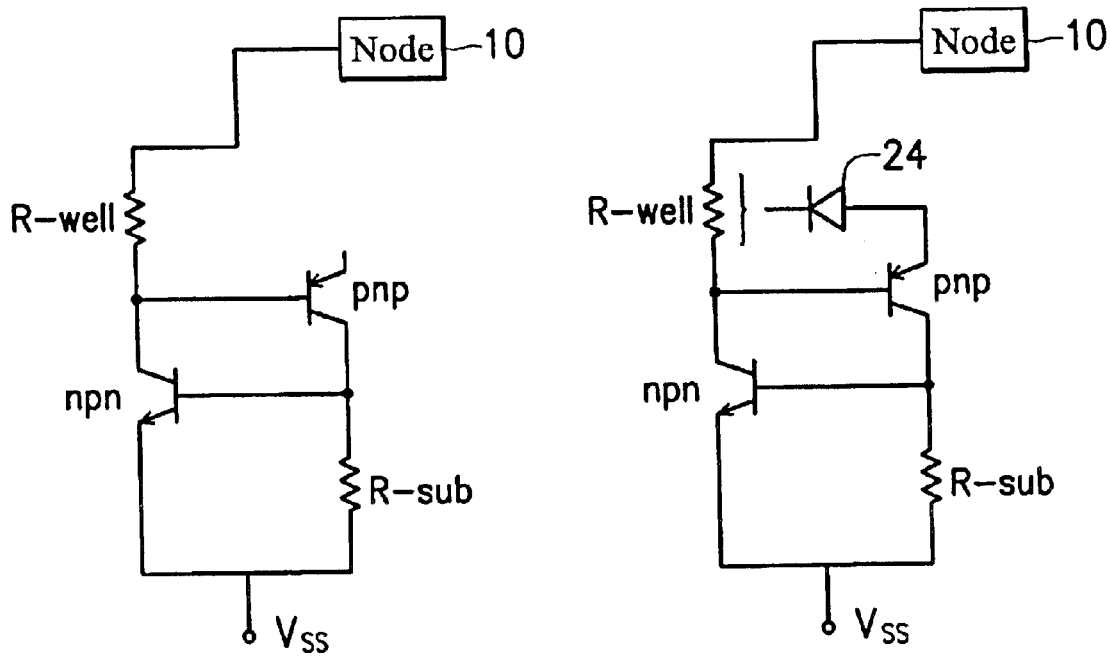
FIG. 2A to FIG. 2B are the schematic circuit diagrams of the ESD protection circuit in FIG. 1.

Refer to FIGS. 2A and 2B, both representing the schematic diagram shown in FIG. 1. The well region 14, the substrate 12 and the second doping region 18 form the collector, the base, and the emitter of a lateral npn BJT, respectively. The collector is electrically coupled to node 10 via the R-well resistor, the base is electrically coupled to the reference potential Vss via the R-sub resistor and the emitter is electrically coupled to the reference potential Vss directly. The collector and base of the vertical pnp BJT are electrically coupled to the base and collector of the lateral npn BJT. Furthermore, the emitter of the vertical pnp BJT is not coupled to any node and therefore is in a floating state as shown in FIG. 2A. On the other hand, there is a reversed diode between the resistor R-well and the emitter of the vertical pnp BJT as shown in FIG. 2B.

Figure 3:
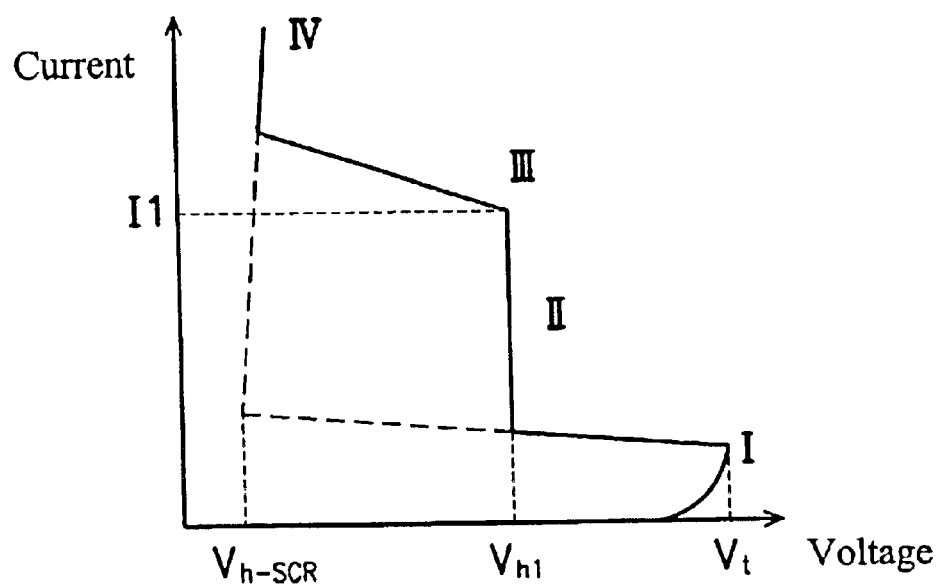
FIG. 3 shows the IV curves derived from the ESD protection circuit in FIG. 1 and the conventional SCR ESD protection circuit.

FIG. 3 is an IV curve of the ESD protection circuit shown in FIG. 1 and a conventional ESD circuit. In FIG. 3, the continuous line represents the IV curve of the ESD protection circuit shown in FIG. 1. When the first doping area 16 in FIG. 1 is electrically coupled to node 10, the whole circuit becomes a conventional ESD protection circuit with a conventional SCR. The dotted line represents the IV curve of the conventional ESD protection circuit shall not be described further herein. The distinctions between the IV curves derived from the ESD protection circuit of the present invention and the conventional ESD protection circuit are explained with the segregated sections I, II, III and IV as shown in FIG. 3.

As with the IV curve of the conventional ESD protection circuit with the conventional SCR, in section I, when potential at the node 10 reaches a breakdown voltage (that is the trigger potential $V_t$) at the interface between well region 14 and substrate 12, the lateral pnp BJT is triggered by the leakage current at the interface, and thus the current is increased along with the input voltage. The physics principle behind section II is yet to be explained, but one possibility is that the first doping region 16 and the third doping region 20 begin to be connected and form a parasitic SCR with a current gain β less than 1. Thus, the potential at node 10 is held to a first holding potential Vh1, as shown in section II.

When holding at potential Vh1, there is only one conductive lateral npn BJT, in contrast to the two conductive BJTs of the conventional SCR. As a result, the first holding potential Vh1 is greater than the holding potential Vh-SCR of the conventional SCR.

Furthermore, when the current is greater than a predetermined current IL, the well region 14 forms a high injection status. In other words, the concentration product of electrons and holes in well region 14 is greater than the square of the intrinsic concentration. In the mean time, great amounts of electrons and holes are formed on the interface between the first doping region 16 and well region 14. Thereby, the electrically insulating function is eventually diminished. The current gain β of the parasitic SCR approaches 1 while the voltage at pad 10 is gets lower, as shown the section III in FIG. 3. When a great amount of the current floats through the well region 14 toward the first doping region 16, the voltage difference between the first doping region 16 and the well region 14 could become greater than 0.7 volt, thus triggering the conductivity of the transistor of the vertical pnp BJT. Under the condition that both pnp BJT and npn BJT are conductive, the ESD protection circuit of the present invention may hold the potential at node 10 to a very low second hold potential, about 1.6 volt as shown in the IV section. The predetermined current IL at section III can be controlled according to experiments or layout design.

Figure 4:
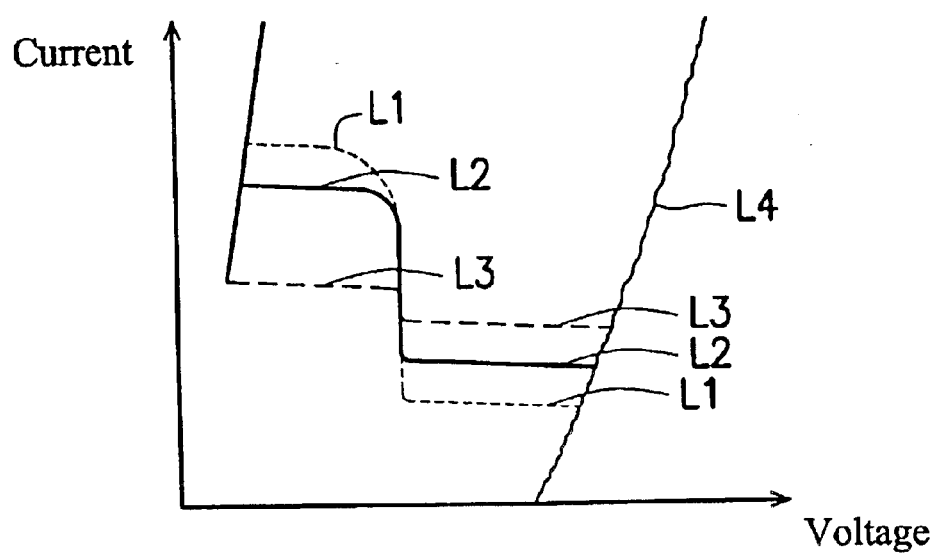
FIG. 4 illustrates the IV curves of experimental measurements of different distances between the first doping region and the third doping region.

FIG. 4 is a schematic graph according to 4 sets of experimental data. Referring to the graph, the curves generated from the 4 experimental data sets are L1, L2, L3 and L4, respectively. The distances from the first doping region 16 to the third doping region 20 of the ESD protection circuit generating curves L1, L2 and L3 are 1 μm, 2 μm and 3 μm, respectively. The curve L4 is the result of the ESD circuit with no the first doping region 16. Obviously, the curve L4 is an IV curve of the collector of a BJT with its emitter and the base connected the ground. The tendencies of curves L1 to L3 are explained as follows. When the first doping region 16 and the floated third doping region 20 are getting further apart, the chances that the first doping region 16 and the third doping region 20 are connected become smaller. In other words, more current is needed to link the first doping region 16 to the third doping region 20, as shown at the right side of FIG. 4. Similarly, when the distance between the first doping region 16 and the floated third doping region 20 is getting further apart, the R-well is getting larger and the smaller current is needed to let the voltage difference between the first doping region 16 and the third doping region 20 reach 0.7 voltage in order to trigger SCR, as shown in the left side of FIG. 4.

In the ESD protection circuit of the present invention, there are two controllable parameters, the first holding potential Vh1 and the predetermined current IL. One ideal condition suggested is to let the first holding potential Vh1 become greater than the supply voltage sustaining the normal operation of the integrated circuit (IC), and set IL between the maximum current of EMC/ESD testing and the general ESD testing current. Thus, when performing the EMC/ESD testing, the ESD protection circuit of the present invention releases the ESD current via section I and section II. Moreover, after the EMC/ESD testing, the supply potential will be smaller than the first holding potential Vh1, and the ESD protection circuit will return to the off state as a result. Thus, when performing the general ESD testing for the human body mode and the machine mode, a substantial amount of current is released through section IV of the IV curve for providing good ESD protection.

Figure 5A:
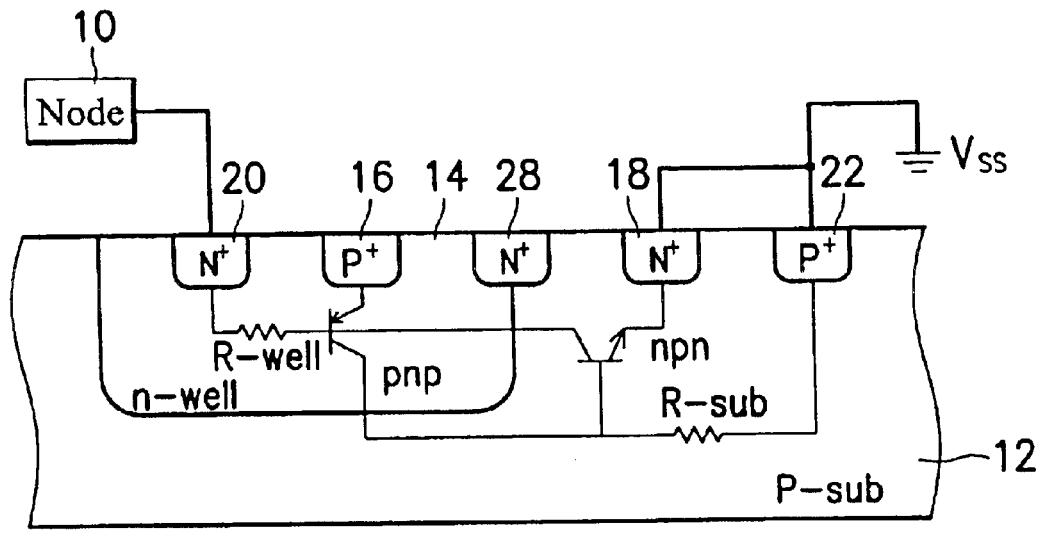
FIG. 5A and FIG. 5B illustrate the second and the third embodiment of the ESD protection circuit of the present invention.
Figure 5B:
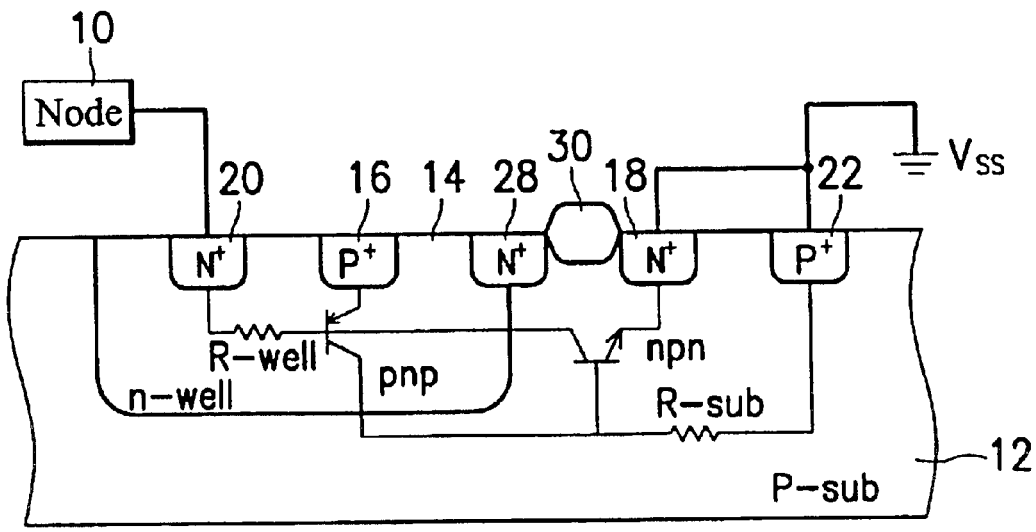

FIG. 5A and FIG. 5B are the ESD protection circuits of the second and the third embodiments of the present invention for reducing the triggering potential Vt. An n-type fifth doping region 28 is disposed on the interface formed by the well region 14 and the base 12. Because the doping concentration of the fifth doping region 28 is relatively greater than that of the well region 14, the breakdown voltage of the pn connecting junction formed by the fifth doping region 28 is low. Thus, the triggering voltage Vt of the whole ESD protection circuit is consequently reduced. In FIG. 5B, there is an additional field oxide layer 30 on the surface of base 12 adjacent to the fifth doping region 28. The local region of substrate 12 below the field oxide layer 30 is usually doped heavier to form a channel stopper. As a result, the breakdown voltage of the pn connecting junction formed by the edge of field oxide layer 30 and the fifth doping region 28 will become lower; consequently, the triggering voltage Vt will get lower as well.

Figure 6A:
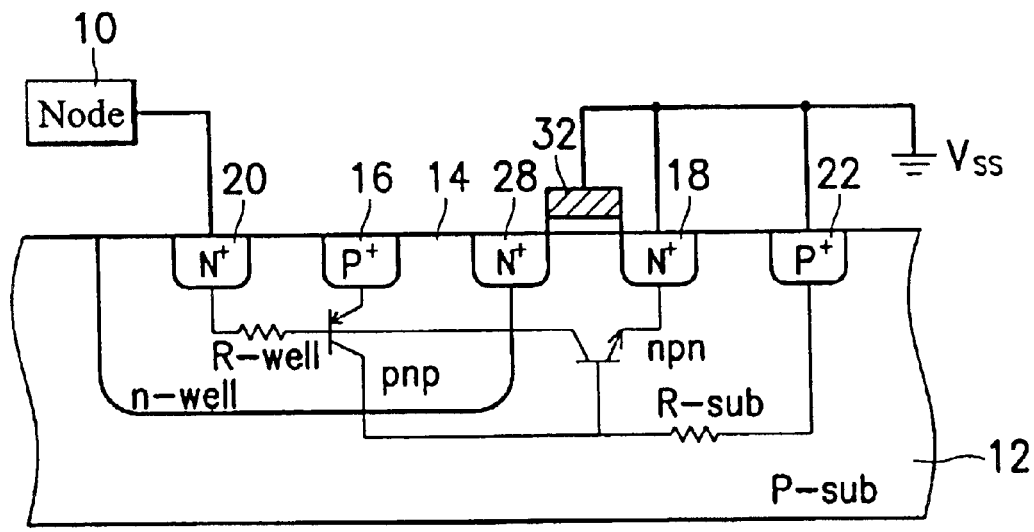
FIG. 6A to FIG. 6C illustrate the fourth embodiment of the ESD protection circuit of the present invention.

FIG. 6A is the fourth embodiment of the ESD protection circuit of the present invention. The ESD protection circuit of the present invention further comprises a MOS transistor M1. M1 is located on substrate 12, comprised of a gate and two source/drain electrodes.

Figure 6B:
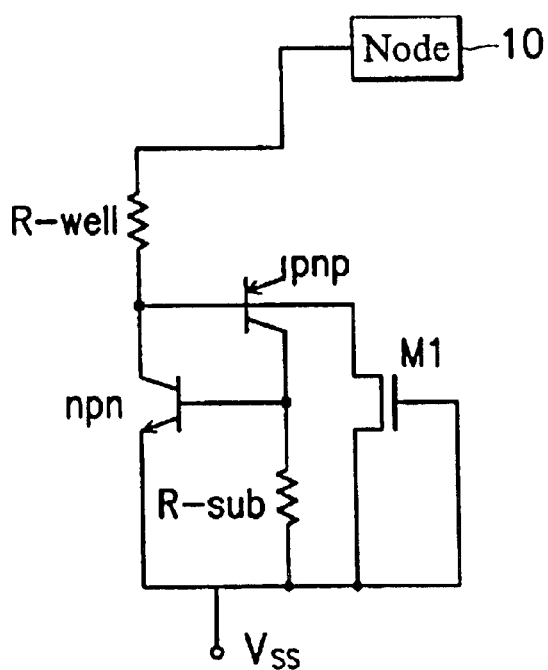
Figure 6C:
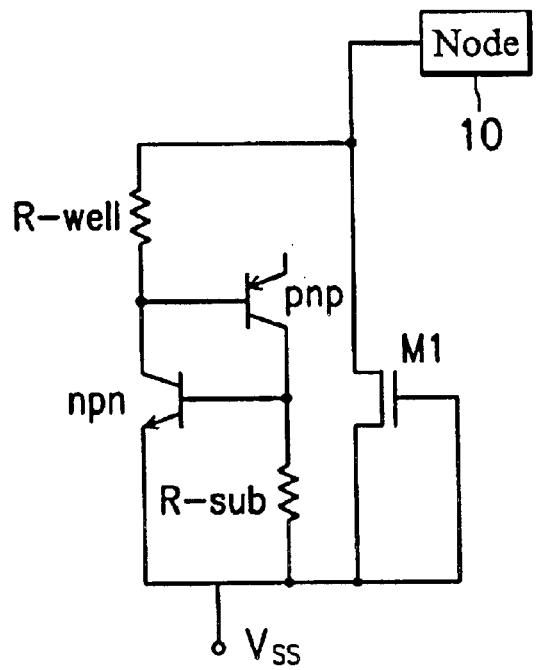

In the fourth embodiment, one source/drain electrode is electrically coupled to the well region 14, and the other source/drain electrode and the gate are electrically coupled to reference voltage VSS. One source/drain electrode of M1 may consist of the fifth doping region 28 and the other source/drain consist of the second doping region 18 as shown in FIG. 6A. FIG. 6B and FIG. 6C are the equivalent circuit diagrams of FIB.6A. There are two ways to express the source/drain of M1 in circuit. Referring to FIG. 6B, one is to form a direct linkage to node 10. Referring to FIG. 6C, the other is to electrically couple to node 10 via resistor R-well. The fact that M1 reduces the triggering voltage Vt is generally know in the conventional art, shall not be further described here.

Figure 7A:
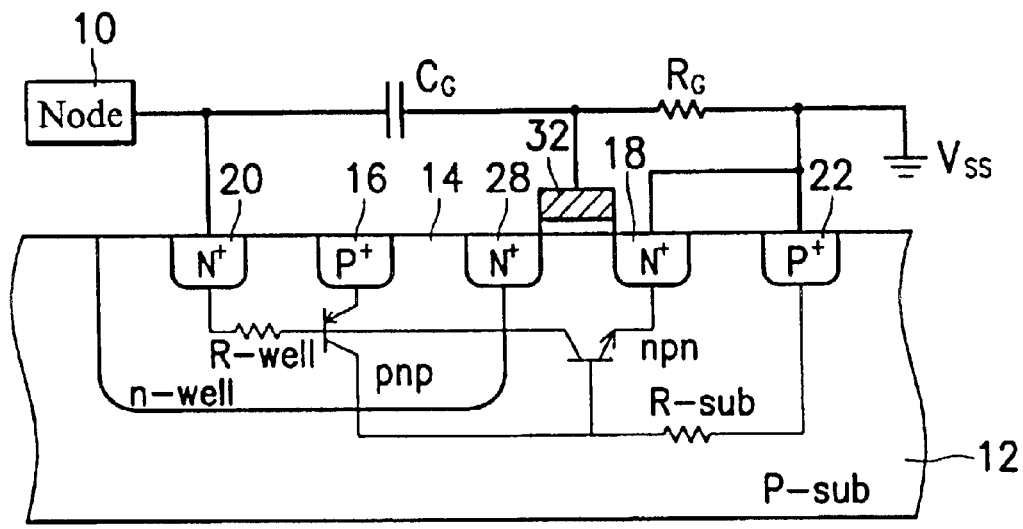
FIG. 7A is the fifth embodiment of the ESD protection circuit of the present invention.
Figure 7B:
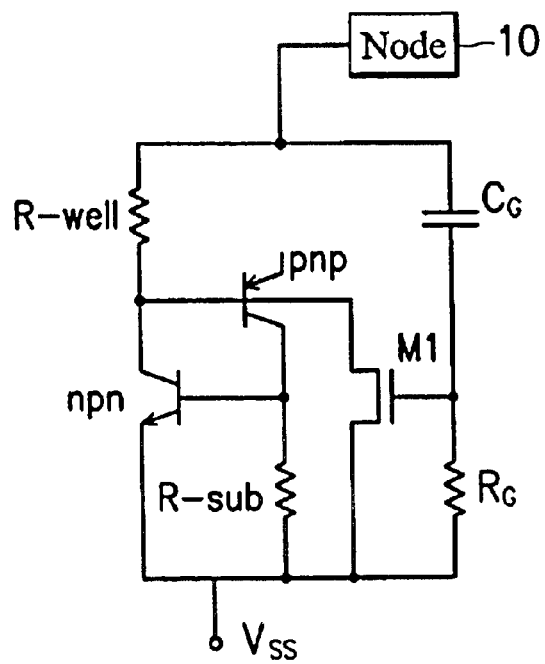
FIG. 7B is the schematic circuit diagram of FIG. 7A.

FIG. 7A is the fifth embodiment of the present invention. FIG. 7B is the schematic circuit diagram of FIG. 7A. A RC delaying circuit is used to judge the ESD event and subsequently bias the gate of M1 for triggering the ESD protection circuit. The ESD protection circuit further comprises a resistor RG and a capacitor CG connected in series. The two ends of resistor RG are respectively electrically coupled to the gate of M1 and reference potential VSS. The two ends of capacitor CG are respectively electrically coupled to the gate of M1 and node 10. The circuit diagram shown in FIG. 7B is simply to add an extra RC delaying circuit on the circuit shown in either FIG. 6B or FIG. 6C. When an ESD event occurs at node 10, because of the electrically coupling effect, the gate potential of M1 is going to increase, further resulting in an early triggering of the lateral npn BFT to discharge the ESD current.

Figure 8:
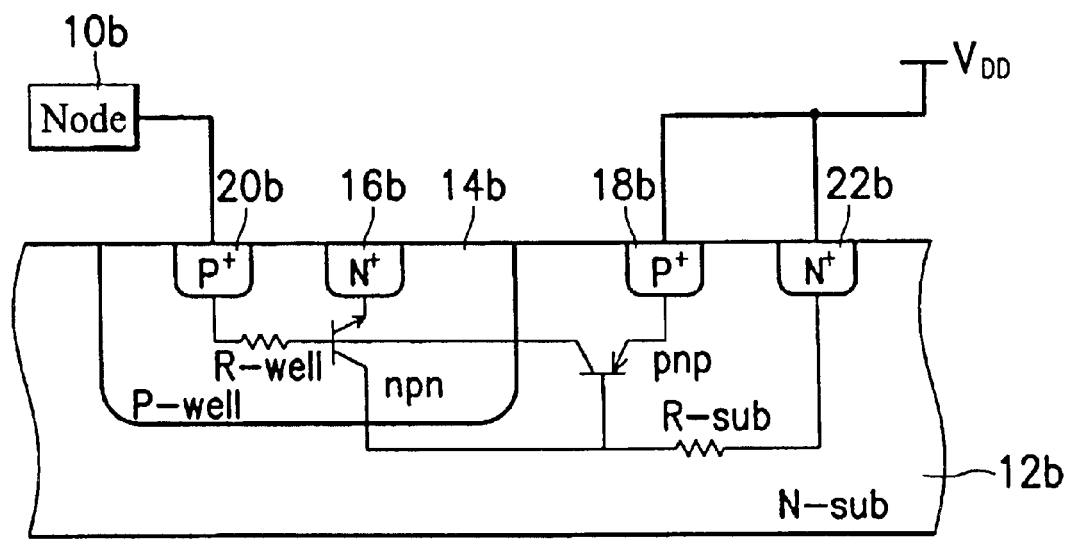
FIG. 8 represents an embodiment of the ESD protection circuit of the present invention wherein the first conductivity type is a n-type and the second conductivity type is a p-type.

Generally, whether the first conductivity type should be an n-type or p-type semiconductor can be the decision of the engineer. FIG. 1 to FIG. 7 show embodiments wherein the first conductivity type is p-type and the second conductivity type is n-type. FIG. 8 shows an embodiment wherein the first conductivity type is n-type and the second conductivity type is p-type. As shown in FIG. 8, the ESD protection circuit is comprised of an n-type substrate 12$b$, a p-type well region 14$b$, an n-type first doping region 16$b$, a p-type second doping region 18$b$, an n-type third doping region 20$b$ and an n-type forth doping region 22$b$. The first doping region 16$b$, well region 14$b$ and substrate 12$b$ form a npn BJT. The well region 14$b$, substrate 12$b$ and the second doping region 18$b$ form a pnp BJT. The first doping region remains floated. The well region 14$b$ is coupled to node 10$b$ through the third doping region 20$b$. The second doping region 18$b$ is coupled to a reference potential VDD. The substrate 12$b$ is coupled to the reference voltage VDD through the forth doping region 22$b$. With such an arrangement, the embodiment of the present invention achieves the requirement for the ESD protection circuit.

Figure 9:
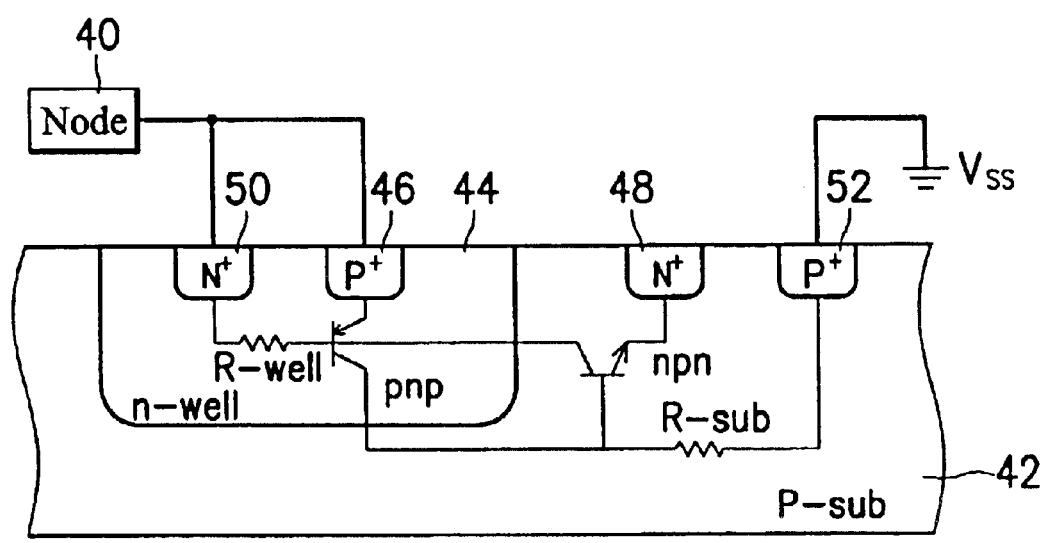
FIG. 9 is an embodiment of the ESD circuit of the present invention wherein the floating region is disposed in the substrate.
Figure 10A:
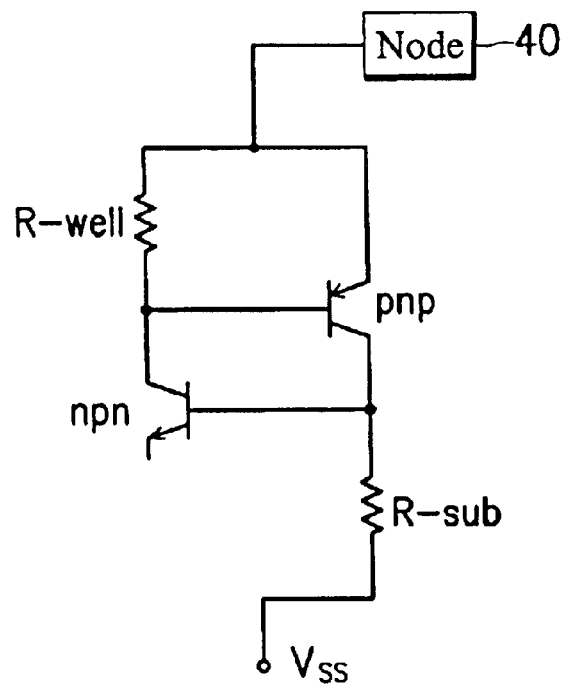
FIG. 10A and FIG. 10B are the equivalent diagrams of FIG. 9.
Figure 10B:
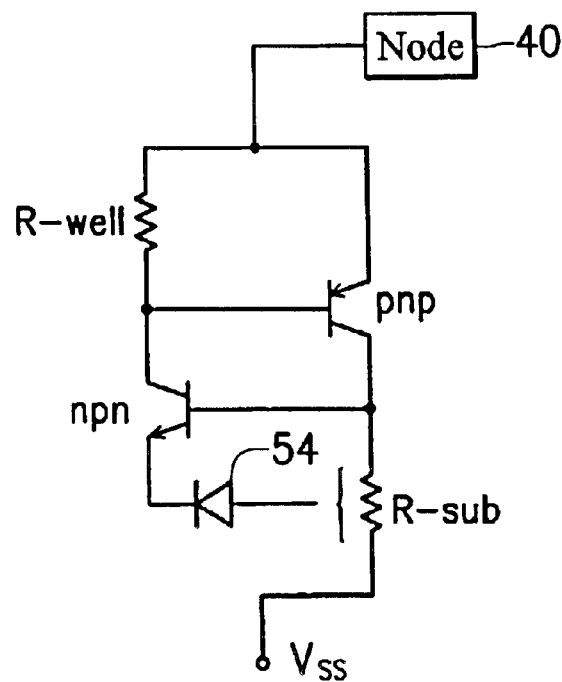

The present invention further provides an ESD protection circuit with a collector region having the addition of a floated region with the opposite electrical conductivity type as shown in FIG. 9. The ESD protection circuit of the present invention is coupled to a node 40 and a reference potential VSS for releasing the ESD current from node 40. The ESD protection circuit comprises a p-type substrate 42, a n-type well region 44, a p-type first doping region 46, a n type second doping region 48, an n-type third doping region 50 and a p-type forth doping region 52. Substrate 42 is electrically coupled to the reference potential VSS through the ohmic contact formed by the forth doping region 52. Well region 44 is deposited on substrate 42 and electrically coupled to node 40. The first doping region 46 is deposited on the surface of well region 44, and is electrically coupled to node 40 through the ohmic contact formed by the third doping region 50. The third doping region 48 is electrically floated on base 42. The first doping region 46, well region 44 and substrate 42 form the emitter, base and collector of a pnp BJT respectively. Hence, base 42 is also called the collector region. The second doping region 48 is electrically floated in the collector region, and forms a PN junction with the collector region. FIG. 10A and FIG. 10B are the equivalent circuits of the diagram shown in FIG. 9, such that the ESD protection circuit can achieve the IV curve shown in FIG. 3. The resulting effect has been explained in the previous embodiment and thus will not described further.

Figure 11A:
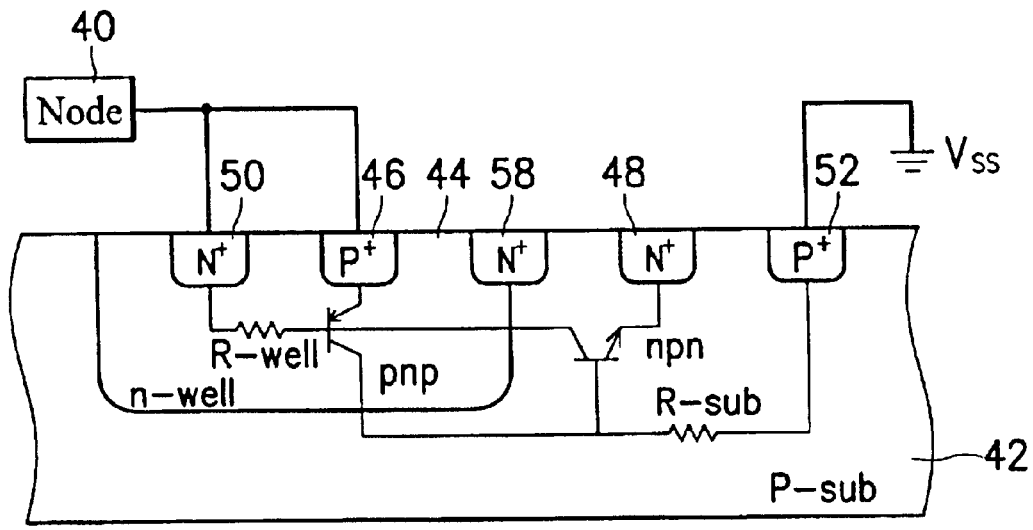
FIG. 11A and FIG. 11B illustrate the two embodiments on which decrease the triggering voltage of the ESD protection circuit in FIG. 9.
Figure 11B:
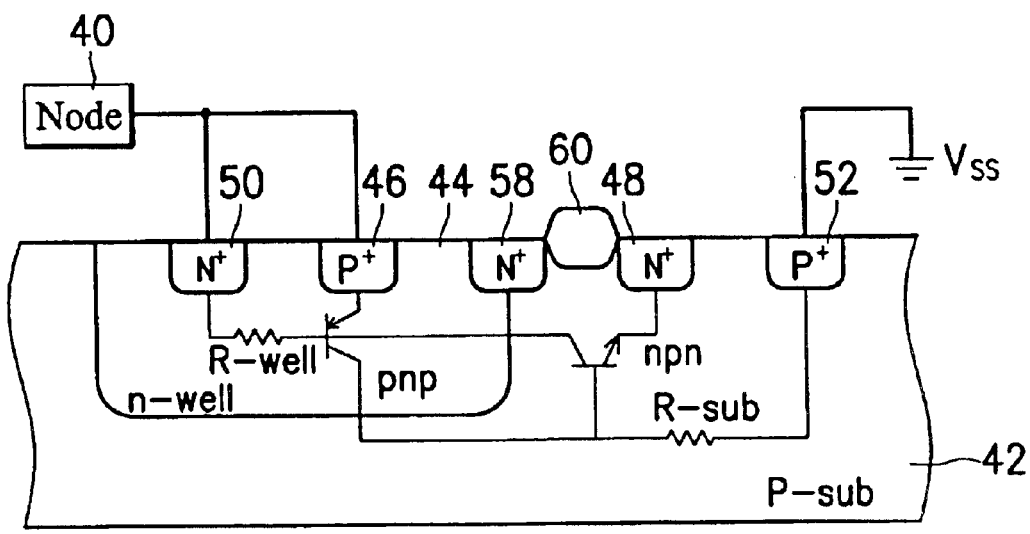
Figure 12A:
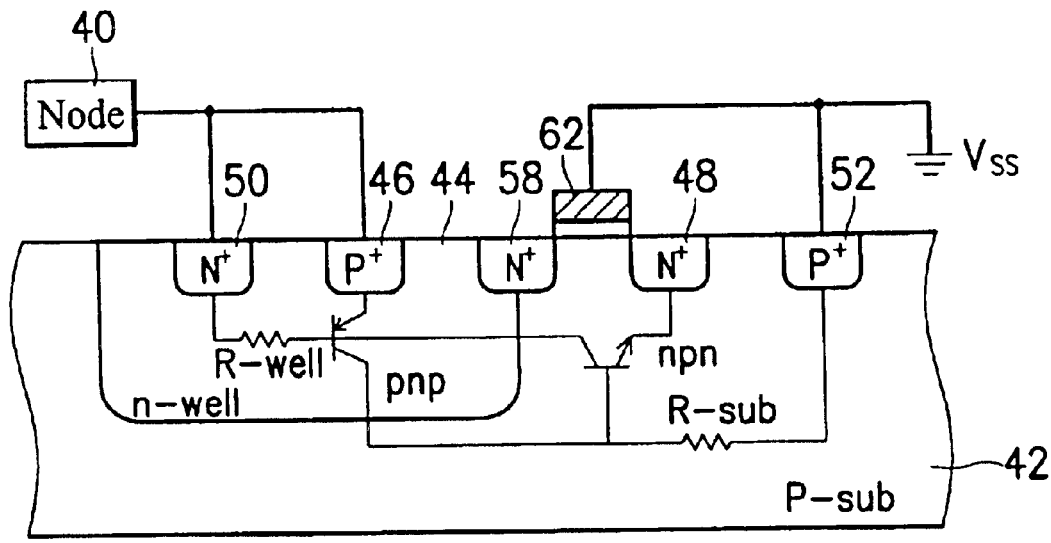
FIG. 12A and FIG. 12B illustrate the two embodiments which decrease the triggering voltage of the ESD protect circuit in FIG. 9.
Figure 12B:
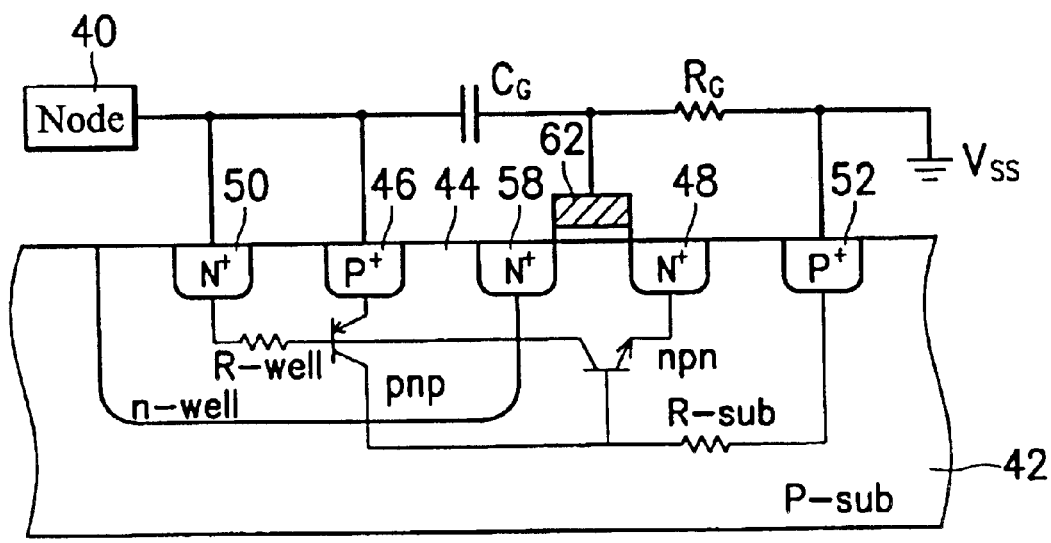

There can be numerous modification made to the ESD protection circuit in FIG. 9 for decreasing the triggering voltage Vt of the ESD protection circuit. A few types of modifications are described as followed. The first kind of modification is forming an n-type fifth doping region 58 on the PN junction formed by well region 44 and substrate 42, as shown in FIG. 11A. Since the fifth doping region is doped heavier, the breakdown voltage at the PN junction formed hereby is lower. The second modification type is to form a field oxide 60 beside the fifth doping region 58, as shown in FIG. 11B. Since the substrate 42 beneath the field oxide 60 is usually doped heavier, the breakdown voltage at the edge of the field oxide 60 gets even lower. The third kind of modification is forming an n-type MOS transistor on base 42 as shown in FIG. 12. Gate 62 of the n-type MOS transistor is coupled to the reference voltage VSS. The fifth doping region as the source/drain is coupled to node 40 through well region 44. It is widely known to the people skilled in the art that the breakdown voltage of the source/drain of the n-type MOS transistor with respect to the substrate is lower than that of the well region 44 with respect to substrate 42. The configuration shown in FIG. 12A can thus reduce the triggering voltage of the ESD protection circuit. Alternatively, gate 60 of the n-type MOS transistor may link to the reference voltage VSS through a resistor RG indirectly. Additionally, a capacitor may be configured between gate 62 and node 40 as shown in FIG. 12B. The RC circuit formed by capacitor CG and resistor RG may be applied on detecting the ESD event at node 40, as well as providing a voltage on gate 62 for triggering the ESD protection circuit.

Figure 13A:
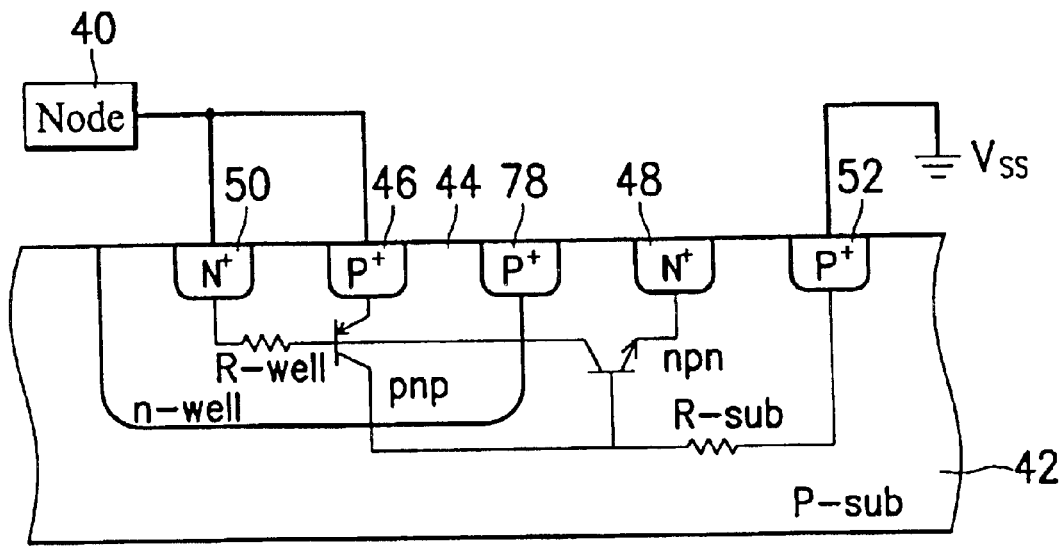
FIG. 13A to FIG. 13D illustrate the embodiments wherein the well region and the substrate region are formed on the p-type sixth dopin region.

Referring to FIG. 13A, the n-type fifth doping region 58 in either FIG. 12A or 12B is replaced with a p-type sixth doping region 78 under the condition that the effect of lowering the triggering voltage of the ESD protection circuit remains unchanged.

Figure 13B:
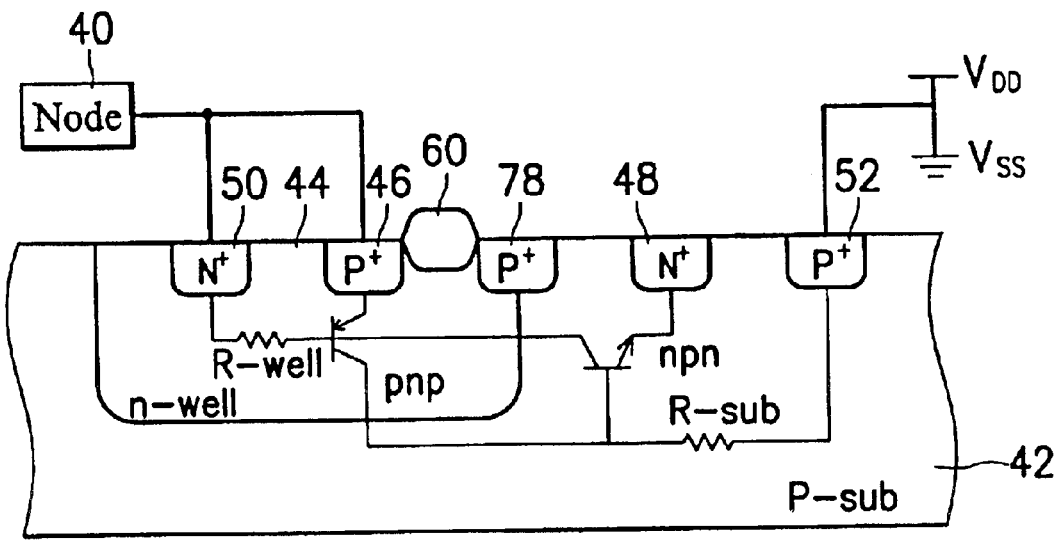
Figure 13C:
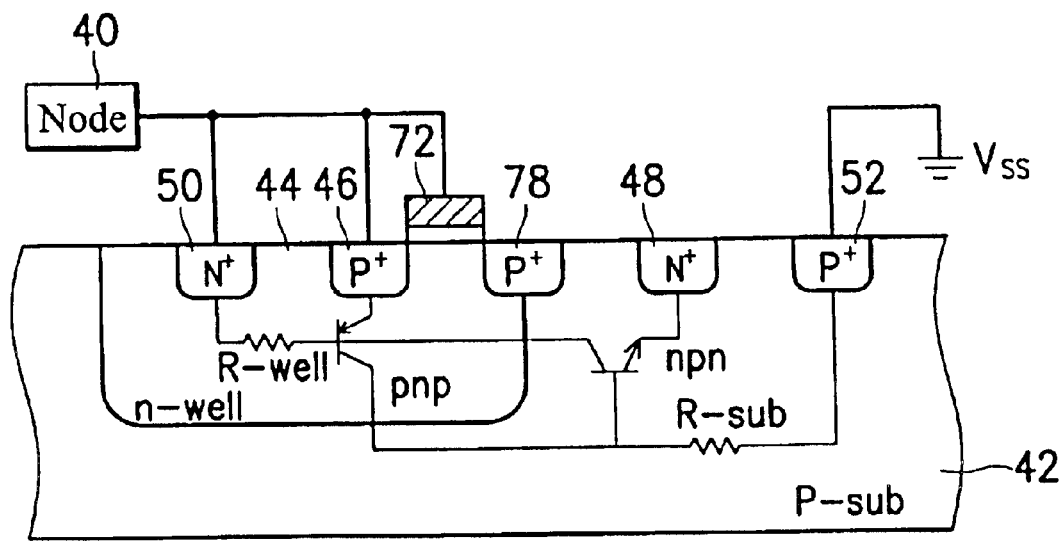
Figure 13D:
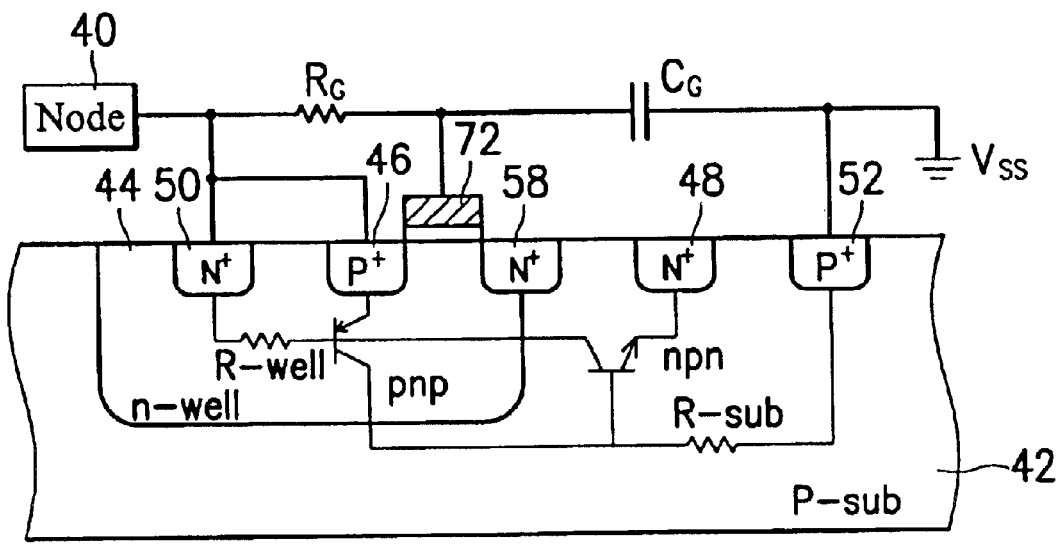

The p-type in the sixth doping region 78 is doped heavier than substrate 42. Therefore, the breakdown voltage at the PN junction formed by the sixth doping region 78 and well region 44 is lower than the breakdown voltage of the PN junction formed by substrate 42 and well region 44. Likewise, a field oxide can also be deposited on well region 44 adjacent to the sixth doping region 78, as shown in FIG. 13B. The well region 44$b$ beneath the field oxide layer 60 normally is doped heavier to form a channel stopper, so that the breakdown voltage of the pn junction at the edge of the field oxide is lower than that formed by the surface of well region 44 and the substrate 42. A p-type MOS formed at well region 44, as shown in FIG. 13C, may also lower the triggering voltage of the ESD protection circuit. Referring to FIG. 13C, gate 72 of the p-type MOS is coupled to node 40, and the two source/drain electrodes are respectively constructed by the first doping region 46 and the second doping region 78. RC delay circuit may also be placed into the circuit shown in FIG. 3C as the detector for the ESD event. The gate 72 of the p-type MOS transistor is coupled to node 40 through a resistor RG. Additionally, between the gate 72 of the p-type MOS transistor and reference voltage VSS, a capacitor CG may be disposed. Once the ESD event starts to take place, the gate of the p-type MOS transistor is coupled to capacitor CG that triggers the whole ESD protection circuit.

Figure 14:
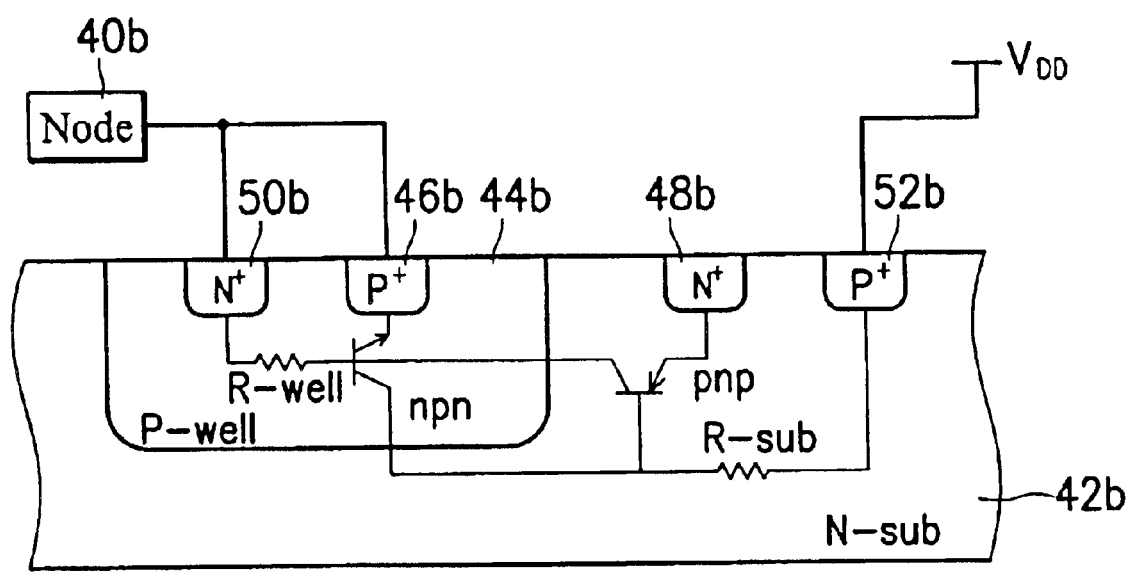
FIG. 14 illustrate an embodiment of the present invention wherein the first conductivity type is an n-type and the second conductivity type is a p-type.

Again, whether the first conductivity type is n-type or a p-type depends on the discretion of the engineer. FIG. 9 to FIG. 13 illustrate the embodiment wherein the first conductivity type is p-type and the second conductivity type is n-type. In comparison, FIG. 14 is the embodiment wherein the first conductivity type is n-type and the second conductivity type is p-type. Referring to FIG. 14, the embodiment of the present invention comprises a n-type substrate 42$b$, a p-type well region 44$b$, an n-type first doping region 46$b$, a p-type second doping region 48$b$, a p-type third doping region 50$b$, and an n-type forth doping region 52$b$. The first doping region 46$b$, well region 44$b$ and the substrate 42$b$ form an npn BJT. Well region 44$b$, substrate 42$b$ and the second doping region 48b form a pnp BJT. The second doping region 48b remains electrically floated, while well region 46b is coupled to node 40b through the third doping region 50b, the first doping region 46b is coupled to node 40b and substrate 42b is coupled to reference potential VDD through the forth doping region 52b.

Generally, the present invention provides an ESD protection circuit constituted mainly of a BJT. The BJT can be either a npn BJT or a pnp BJT. It achieves the reduction of the holding potential at the high current by disposing a floating area in the collector of the BJT having the opposite conductivity type of the collector.

Compared to the conventional ESD protection circuit constituted mainly of SCR, the first holding potential Vh1 of the present invention is higher than the supply voltage. It can thus eliminate the latching problem faced by conventional ESD protection circuit constituted of SCR. Compared to the conventional ESD protection circuit constituted of BJT, the present invention provides a floated first doping area in the collector of the lateral npn transistor, such that a rather low second holding potential can be obtained when proceeding high voltage ESD testing.

The ESD protection circuit of the present invention reduces the energy consumption, miniaturizes the transistor size, and saves cost.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Similarly, any process steps described herein may be interchangeable with other steps in order to achieve the same result. Therefore, the scope of the appended claims should be accorded the broadest interpretation so as to encompass all such modifications and similar arrangements, which is defined by the following claims and their equivalents.

What is claimed is:

1. An electrostatic discharge protection circuit with high trigger current, coupled to a node and a reference potential for dissipating the electrostatic voltage formed at said node, said electrostatic discharge protection circuit comprising:

a substrate having a first conductivity type, coupled to said reference potential;

a well region having a second conductivity type, formed on said substrate and coupled to said node;

a first doping region having said first conductivity type, electrically coupled to said node;

a second doping region having said second conductivity type, disposed on said substrate and electrically floated on said substrate; and a fifth doping region having said second conductivity type, disposed at the conjunction of said well region and said substrate, for reducing the breakdown voltage at the conjunction of said well region and said substrate.

2. The electrostatic discharge protection circuit as claimed in claim 1 further comprising a third doping area having said second conductivity type, disposed in said well region, electrically coupled to said node, for forming an ohmic connection at said well region.

3. The electrostatic discharge protection circuit as claimed in claim 1 further comprising a forth doping region having said first conductivity type, disposed at the surface of said substrate near said well region, electrically coupled to said reference potential, for forming an ohmic connection at said substrate.

4. The electrostatic discharge protection circuit as claimed in claim 1, wherein said first conductivity is p-type, and said second conductivity is n-type.

5. The electrostatic discharge protection circuit as claimed in claim 1 further comprising a field oxide layer, disposed at the surface of said substrate and between said second and fifth doping regions.

6. The electrostatic discharge protection circuit as claimed in claim 1 further comprising a gate disposed above the surface of said substrate and between said second and fifth doping regions.

7. The electrostatic discharge protection circuit as claimed in claim 6 further comprising:

a resistor with two ends electrically coupled to said gate and said reference potential, respectively; and a capacitor with two ends electrically coupled to said gate and said node, respectively.

* * * * *